US011744166B2

(12) United States Patent
Wang et al.

(10) Patent No.: US 11,744,166 B2
(45) Date of Patent: Aug. 29, 2023

(54) RESISTIVE MEMORY ELEMENTS WITH MULTIPLE INPUT TERMINALS

(71) Applicant: GLOBALFOUNDRIES Singapore Pte. Ltd., Singapore (SG)

(72) Inventors: Lanxiang Wang, Singapore (SG); Shyue Seng Tan, Singapore (SG); Eng Huat Toh, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 323 days.

(21) Appl. No.: 17/007,759

(22) Filed: Aug. 31, 2020

(65) Prior Publication Data
US 2022/0069213 A1    Mar. 3, 2022

(51) Int. Cl.
*H01L 45/00* (2006.01)
*H10N 70/00* (2023.01)
*H10B 63/00* (2023.01)

(52) U.S. Cl.
CPC ............ *H10N 70/841* (2023.02); *H10B 63/00* (2023.02); *H10N 70/063* (2023.02); *H10N 70/8833* (2023.02)

(58) Field of Classification Search
CPC ............ H01L 45/1233; H01L 45/1253; H10N 70/826
See application file for complete search history.

(56) References Cited

U.S. PATENT DOCUMENTS

| | | | |
|---|---|---|---|
| 9,431,604 B2 | 8/2016 | Liao et al. | |
| 9,530,493 B2* | 12/2016 | Eleftheriou | H01L 45/16 |
| 2021/0280638 A1* | 9/2021 | Li | H01L 45/16 |

OTHER PUBLICATIONS

H. Mahmoudi, V. Sverdlov and S. Selberherr, "MTJ-based implication logic gates and circuit architecture for large-scale spintronic stateful logic systems," 2012 Proceedings of the European Solid-State Device Research Conference (ESSDERC), Bordeaux, 2012, pp. 254-257.
Z. Wei et al., "Highly reliable TaOx ReRAM and direct evidence of redox reaction mechanism," 2008 IEEE Internationa Electron Devices Meeting, San Francisco, CA, 2008, pp. 1-4.
Waser et al., "Nanoionics-based resistive switching memories", Nanoscience and Technology, pp. 158-165 (2009).
S. Lashkare, S. Chouhan, T. Chavan, A. Bhat, P. Kumbhare and U. Ganguly, "PCMO RRAM for Integrate-and-Fire Neuron in Spiking Neural Networks," in IEEE Electron Device Letters, vol. 39, No. 4, pp. 484-487, Apr. 2018.
Borghetti, J., Snider, G., Kuekes, P. et al. 'Memristive' switches enable 'stateful' logic operations via material implication. Nature 464, 873-876 (2010).
Yan et al., "Resistive Memory-Based In-Memory Computing: From Device and Large-Scale Integration System Perspectives", Advanced Intelligent Systems, Volume1, Issue 7, Nov. 2019.

* cited by examiner

*Primary Examiner* — Mark V Prenty
(74) *Attorney, Agent, or Firm* — Thompson Hine LLP

(57) ABSTRACT

Structures for a resistive memory element and methods of forming a structure for a resistive memory element. The resistive memory element has a first electrode, a second electrode, a third electrode, and a switching layer. The first electrode is coupled to the switching layer, the second electrode is coupled to a side surface of the switching layer, and the third electrode is coupled to the switching layer.

20 Claims, 3 Drawing Sheets

RESISTIVE MEMORY ELEMENTS WITH MULTIPLE INPUT TERMINALS

BACKGROUND

The invention relates to integrated circuits and semiconductor device fabrication and, more specifically, to structures for a resistive memory element and methods of forming a structure for a resistive memory element.

A resistive random-access memory (ReRAM or RRAM) device provides one type of embedded non-volatile memory technology. Because its resistive memory elements are non-volatile, the stored bits of data are retained by the resistive random-access memory device when the memory elements are not powered. The non-volatility of a resistive random-access memory device contrasts with volatile memory technologies, such as a static random-access memory (SRAM) device in which the stored content is eventually lost when unpowered and a dynamic random-access memory (DRAM) device in which the stored content is lost if not periodically refreshed.

Data is stored in a resistive memory element by changing the resistance across a switching layer to provide different information-storage states—a high-resistance state and a low-resistance state—representing the stored bits of data. The switching layer can be modified by applying a bias voltage sufficient to create one or more filaments as conductive paths bridging across the thickness of the switching layer, which writes the low-resistance state. The filaments are destroyed, also by the application of a bias voltage, to write the high-resistance state.

Improved structures for a resistive memory element and methods of forming a structure for a resistive memory element are needed.

SUMMARY

According to an embodiment of the invention, a structure includes a resistive memory element having a first electrode, a second electrode, a third electrode, and a switching layer. The first electrode is coupled to the switching layer, the second electrode is coupled to a side surface of the switching layer, and the third electrode is coupled to the switching layer.

According to another embodiment of the invention, a method includes forming a first electrode of a resistive memory element, forming a switching layer of the resistive memory element that is coupled to the first electrode, forming a second electrode of the resistive memory element that is coupled to a side surface of the switching layer, and forming a third electrode of the resistive memory element that is coupled to the switching layer.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
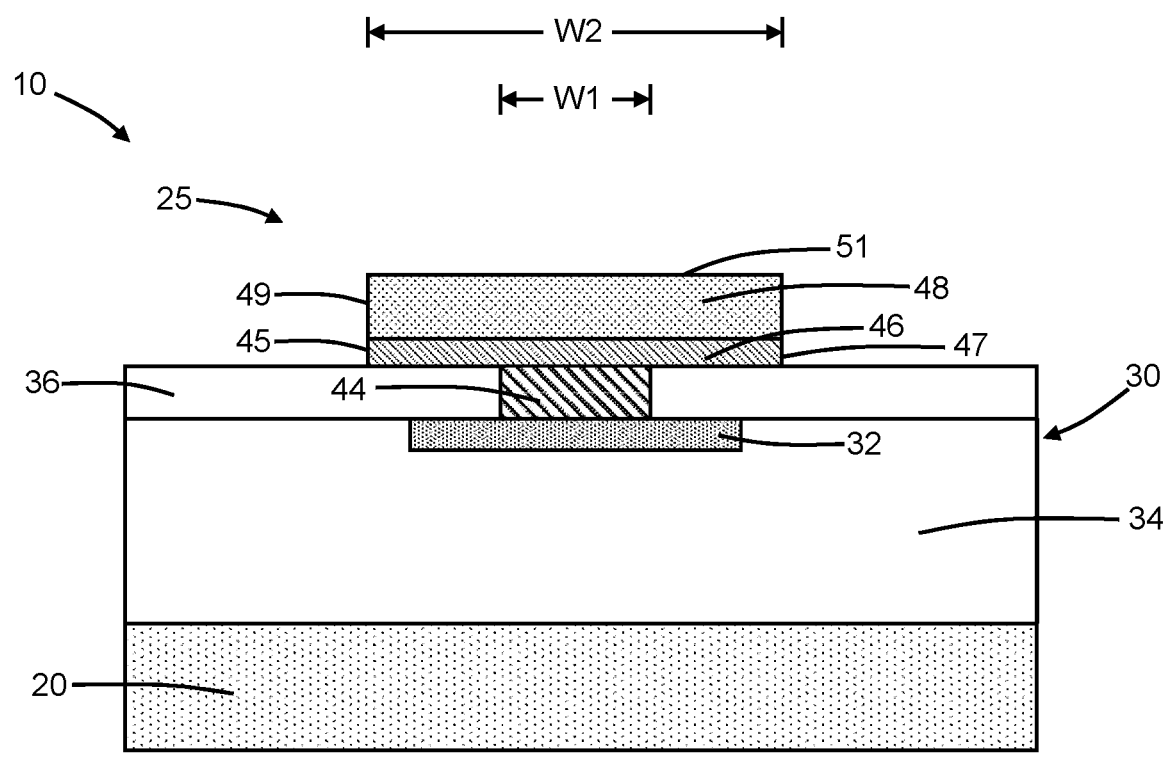
FIGS. 1-2 are diagrammatic cross-sectional views of a structure including a resistive memory element at successive fabrication stages of a processing method in accordance with embodiments of the invention.

With reference to FIG. 1 and in accordance with embodiments of the invention, a structure 10 includes a resistive memory element 25 that may be disposed in a metallization level of an interconnect structure 30. The interconnect structure 30 may be fabricated by middle-of-line and back-end-of-line processing over a substrate 20. The resistive memory element 25 may be positioned over a metal feature 32 in one of the metallization levels, such as the M2 metallization level, of the interconnect structure 30. The interconnect structure 30 includes interlayer dielectric layers 34, 36 that may be comprised of a dielectric material, such as silicon dioxide, and the metal feature 32 may be comprised of a metal, such as copper or aluminum.

The resistive memory element 25 includes a bottom electrode 44 positioned in the interlayer dielectric layer 36 on the metal feature 32, a switching layer 46 positioned over the bottom electrode 44, and an insulator layer 48 positioned over the switching layer 46. The bottom electrode 44 may be comprised of a metal, such as copper, platinum, aluminum, titanium, titanium nitride, tantalum, tantalum nitride, or ruthenium, that may be selected based on factors such as oxidation resistance and work function difference relative to subsequently-formed top electrodes. The switching layer 46 may be comprised of a metal oxide, such as such as PCMO (Pr0.7Ca0.3MnO3), magnesium oxide, tantalum oxide, hafnium oxide, titanium oxide, or aluminum oxide, or may be comprised of a transition metal nitride. The insulator layer 48 may be a dielectric layer comprised of a dielectric material, such as silicon dioxide or silicon nitride.

The bottom electrode 44 may be formed by depositing a layer of its constituent material and patterning the deposited layer with lithography and etching processes. The interlayer dielectric layer 36 is then deposited and planarized to remove topography. The switching layer 46 and insulator layer 48 may be formed by depositing layers of their constituent materials over the interlayer dielectric layer 36 and bottom electrode 44, and patterning the deposited layers with lithography and etching processes.

The switching layer 46 may have a top surface 41, a bottom surface 43 that is opposite to the top surface 41, a side surface 45, and a side surface 47 that is opposite to the side surface 45. The insulator layer 48 may have side surfaces 49 that are respectively aligned with the side surfaces 45, 47 of the switching layer 46, a bottom surface positioned directly over the top surface 41 of the switching layer 46, and a top surface 51 opposite to the bottom surface. The top surface 41 of the switching layer 46 is in contact with the insulator layer 48 and, in an embodiment, the top surface 41 of the switching layer 46 may be in direct physical contact with the bottom surface of the insulator layer 48. In an embodiment, the insulator layer 48 may extend from the side surface 45 of the switching layer 46 to the side surface 47 of the switching layer 46. In an embodiment, the insulator layer 48 may fully cover the top surface 41 of the switching layer 46 such that the entire surface area of the top surface 41 is protected, for example, from the process subsequently forming the top electrodes.

The bottom electrode 44 is laterally positioned between the side surface 45 and the side surface 47 of the switching layer 46. The bottom electrode 44 is positioned beneath the bottom surface 43 of the switching layer 46. The bottom surface 43 of the switching layer 46 is coupled with the bottom electrode 44 and, in an embodiment, the bottom surface 43 of the switching layer 46 may be in direct physical and electrical contact with the bottom electrode 44. The bottom electrode 44 may be narrower in width than the switching layer 46 and, therefore, the bottom electrode 44 may contact only a portion of the bottom surface 43 of the switching layer 46. In that regard, the bottom electrode 44 may have a width, W1, and the switching layer 46 and the insulator layer 48 may have a width, W2, that is greater than the width, W1, of the bottom electrode 44.

Figure 2:
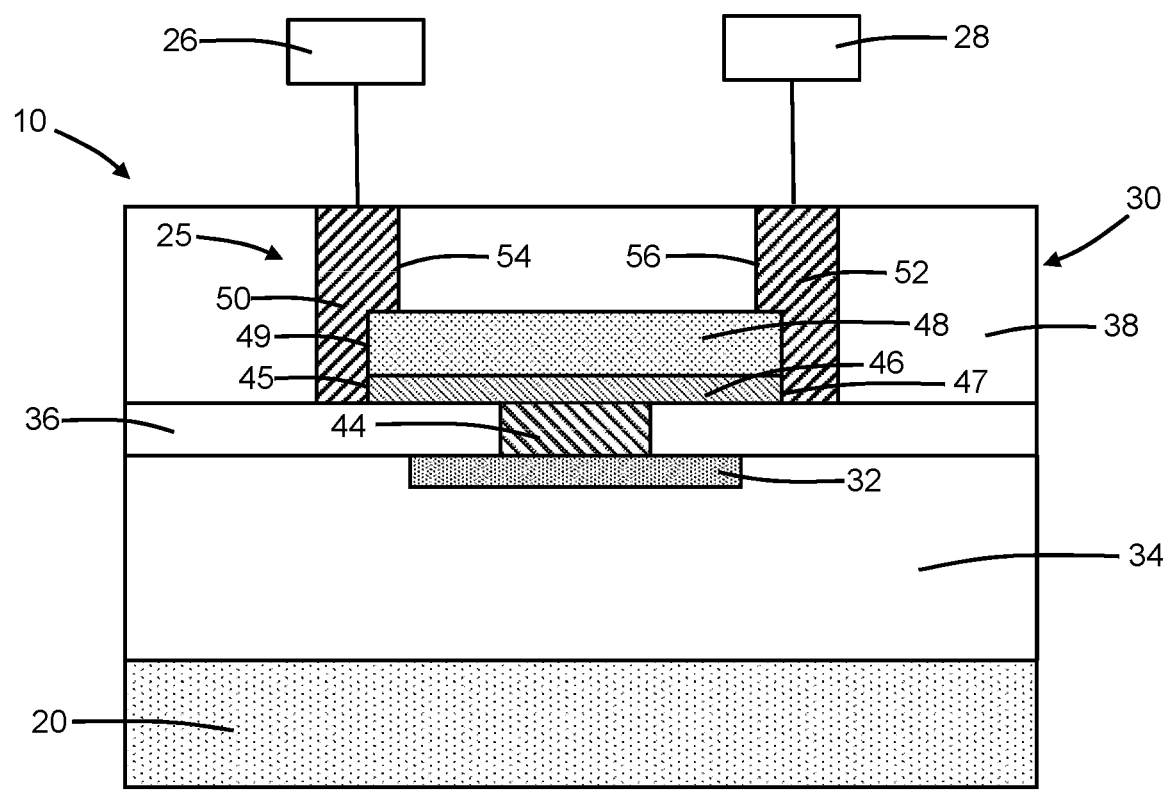

With reference to FIG. 2 in which like reference numerals refer to like features in FIG. 1 and at a subsequent fabrication stage of the processing method, an interlayer dielectric layer 38 of the interconnect structure 30 is formed over the partially-completed resistive memory element 25. The interlayer dielectric layer 38 may be comprised of a dielectric material, such as silicon dioxide, similar or identical to the dielectric material of the interlayer dielectric layers 34, 36.

A top electrode 50 and a top electrode 52 of the resistive memory element 25 are formed in the interlayer dielectric layer 38. The top electrodes 50, 52 may be formed by patterning the interlayer dielectric layer 38 with lithography and etching processes to define openings 54, 56, depositing a metal in the openings 54, 56, and planarizing with chemical-mechanical polishing. The top electrodes 50, 52 may be comprised of a metal, such as platinum, titanium, titanium nitride, tantalum, tantalum nitride, or ruthenium, deposited by, for example, physical vapor deposition. In an embodiment, the top electrode 50 may be comprised of the same metal as the top electrode 52, and the top electrodes 50, 52 may be concurrently formed. In an embodiment, the top electrodes 50, 52 may be comprised of different metals, and the top electrodes 50, 52 may be separately formed, such as by a process sequence of patterning the opening 54, forming the top electrode 50 by deposition and planarization, patterning the opening 56, and forming the top electrode 52 by deposition and planarization. The top electrodes 50, 52 are formed in a self-aligned manner in that the top electrodes 50, 52 are not formed by depositing and patterning a conductor layer with lithography and etching processes. A portion of the dielectric material of the interlayer dielectric layer 38 is positioned over the insulator layer 48 in the space between the top electrode 50 and the top electrode 52 and provides electrical isolation.

The top electrode 50 is positioned in contact with the side surface 45 of the switching layer 46 and, in an embodiment, the top electrode 50 may be positioned in direct physical and electrical contact with the side surface 45 of the switching layer 46. The top electrode 52 is positioned in contact with the side surface 47 of the switching layer 46 and, in an embodiment, the top electrode 52 may be positioned in direct physical and electrical contact with the side surface 47 of the switching layer 46. The bottom electrode 44 and the top electrodes 50, 52 therefore contact different portions of the switching layer 46. The top electrode 50 may also overlap with the top surface 51 of the insulator layer 48, the top electrode 52 may also overlap with the top surface 51 of the insulator layer 48, and the top electrodes 50, 52 may contact the side surface 49 of the insulator layer 48. Portions of the interlayer dielectric layer 36 are positioned between the bottom electrode 44 and the top electrodes 50, 52 because the bottom electrode 44 is narrower than the switching layer 46. These portions of the interlayer dielectric layer 36 contribute to electrically isolating the bottom electrode 44 from the top electrodes 50, 52.

The resistive memory element 25 includes multiple terminals in the form of the bottom electrode 44, the top electrode 50, and the top electrode 52 that may be separately and individually biased with different bias voltages during operation. For example, the top electrode 50 and the top electrode 52 may be used as input terminals that may be separately and individually biased with different bias voltages to provide during operation to provide the low-resistance and high-resistance states. A bias voltage applied from a voltage source 26 to the top electrode 50, with the bottom electrode 44 and the top electrode 52 grounded, may be used in a set operation to switch the switching layer 46 from a low-resistance state to a high-resistance state. A bias voltage applied from a voltage source 28 to the top electrode 52, with the bottom electrode 44 and the top electrode 50 grounded, may be used in a reset operation to switch the switching layer 46 from the high-resistance state to the low-resistance state. A bias voltage applied from another voltage source (not shown) to the bottom electrode 44, with the top electrode 50 and the top electrode 52 floating, may be used to read the state of the resistive memory element 25.

The structure 10 may be used to implement a logic gate and, in that regard, the structure 10 may be used to provide in-memory computing capabilities. For example, the structure 10 may be used to implement an IMPLY gate in which the top electrode 50 and the top electrode 52 provide the resistive memory element 25 with multiple input terminals that may be separately and individually biased with different bias voltages during operation. In that regard, bias voltages may be applied to the top electrode 50 and the top electrode 52 with a bipolar switching scheme to generate a truth table for the IMPLY gate. For example, the resistive memory element 25 may be initially placed in a high-resistance state, each of the top electrodes 50, 52 may then either receive a logical "1" equal to the set voltage or be grounded to provide a logical "0", and the output at the bottom electrode 44 may be logical "1" except if the top electrode 50 is grounded and the top electrode 52 is biased with the set voltage to output a logical "0".

Figure 3:
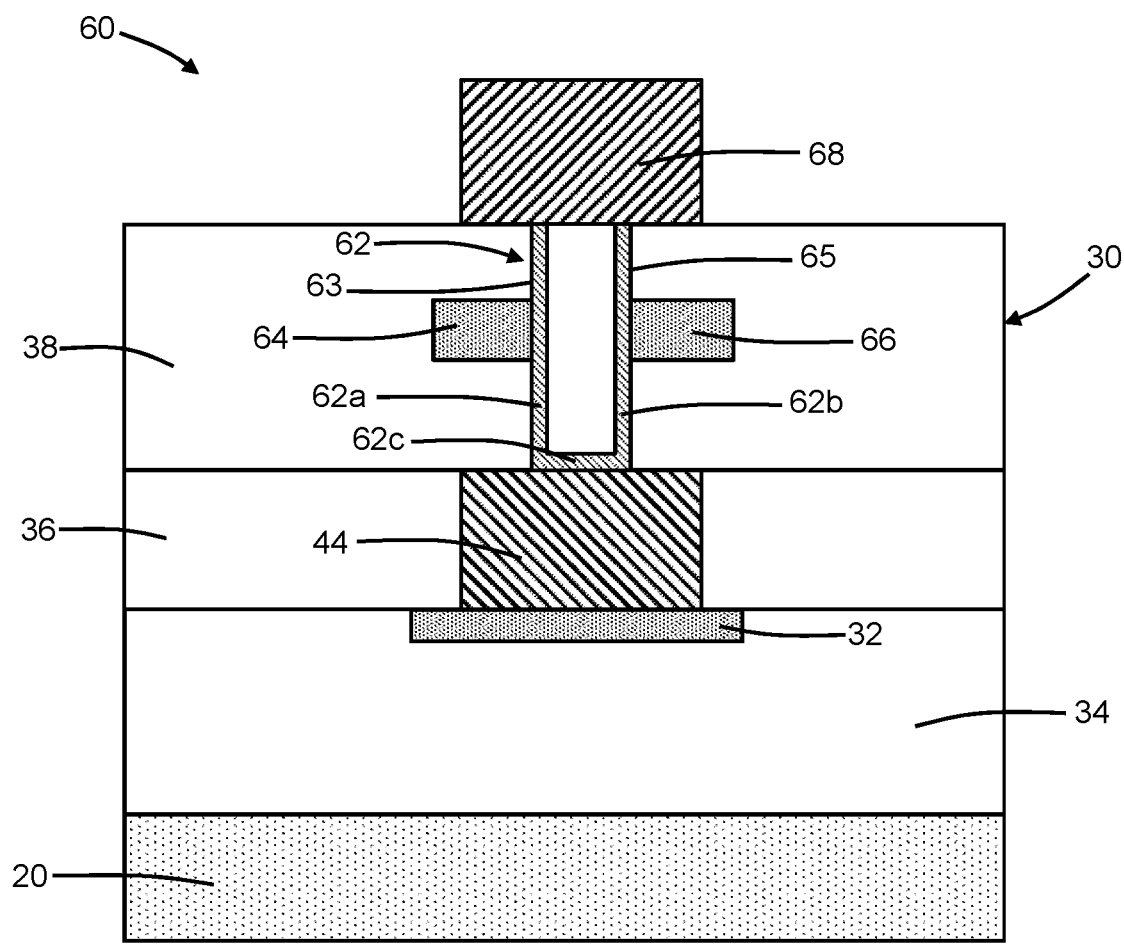
FIG. 3 is a diagrammatic cross-sectional view of a structure including a resistive memory element in accordance with alternative embodiments of the invention.

With reference to FIG. 3 in which like reference numerals refer to like features in FIG. 2 and in accordance with alternative embodiments, a memory element 60 includes a switching layer 62 on and in contact with the bottom electrode 44, electrodes 64, 66 coupled to the switching layer 62, and a top electrode 68 coupled to the switching layer 62. The switching layer 62, which is similar in function and composition to switching layer 46, includes vertical segments 62a, 62b that are connected by a horizontal segment 62c to define a non-planar configuration that is U-shaped. The horizontal segment 62c of the switching layer 62 may be in direct physical and electrical contact with the bottom electrode 44. The electrode 64 may be positioned in direct physical and electrical contact with a side surface 63 of the vertical segment 62a of the switching layer 62. The electrode 66 may be positioned in direct physical and electrical contact with a side surface 65 of the vertical segment 62b of the switching layer 62. The top electrode 68 may be positioned in direct physical and electrical contact with both of the vertical segments 62a, 62b of the switching layer 62. The space surrounded by the switching layer 62 and the top electrode 68 may be filled by the dielectric material of the interlayer dielectric layer 38.

The memory element 60 may be formed by depositing a partial thickness of the interlayer dielectric layer 38 after the bottom electrode 44 is formed. The electrodes 64, 66 may be formed by depositing and patterning a layer containing a metal, such as copper, platinum, aluminum, titanium, titanium nitride, tantalum, tantalum nitride, or ruthenium. The remaining thickness of the interlayer dielectric layer 38 is then deposited and patterned with lithography and etching processes to define an opening laterally between the electrodes 64, 66. The switching layer 62 is deposited as a conformal coating inside the opening, followed by the deposition of additional dielectric material and polishing with chemical-mechanical polishing to remove topography. The top electrode 68 is formed by depositing and patterning a metal layer.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
a resistive memory element including a first electrode, a second electrode, a third electrode, and a switching layer having a first side surface, a second side surface opposite to the first side surface, a bottom surface that extends from the first side surface to the second side surface, and a top surface opposite to the bottom surface, the first electrode positioned beneath the bottom surface laterally between the first side surface and the second side surface, the first electrode coupled to the switching layer, the second electrode coupled to the first side surface of the switching layer, and the third electrode coupled to the second side surface of the switching layer; and
an insulator layer on the top surface of the switching layer.

2. The structure of claim 1 wherein the insulator layer extends from the first side surface of the switching layer to the second side surface of the switching layer.

3. The structure of claim 1 wherein the second electrode overlaps with the insulator layer above the first side surface of the switching layer, and the third electrode overlaps with the insulator layer above the second side surface of the switching layer.

4. The structure of claim 1 wherein the insulator layer fully covers the top surface of the switching layer.

5. The structure of claim 1 wherein the second electrode comprises a first metal, and the third electrode comprises a second metal different in composition from the first metal.

6. A structure comprising:
a resistive memory element including a first electrode, a second electrode, a third electrode, and a switching layer having a first side surface, the first electrode coupled to the switching layer, the second electrode coupled to the first side surface of the switching layer, and the third electrode coupled to the switching layer,
wherein the resistive memory element includes a fourth electrode coupled to the switching layer the switching layer includes a first segment on the first electrode, a second segment that extends from the first segment to the fourth electrode, and a third segment that extends from the first segment to the fourth electrode, and the first segment, the second segment, and the third segment of the switching layer and the fourth electrode surround a space filled by a dielectric material.

7. The structure of claim 6 wherein the second segment of the switching layer includes the first side surface, the third segment of the switching layer includes a second side surface, and the third electrode is coupled to the second side surface of the third segment of the switching layer.

8. The structure of claim 6 wherein the structure further comprises:
a substrate; and
an interconnect structure over the substrate,
wherein the resistive memory element is located in the interconnect structure, the first electrode is positioned in the interconnect structure below the second electrode and the third electrode, and the fourth electrode is positioned in the interconnect structure above the second electrode and the third electrode.

9. The structure of claim 1 further comprising:
an IMPLY gate that includes the resistive memory element.

10. A method comprising:
forming a first electrode of a resistive memory element;
forming a switching layer of the resistive memory element that is coupled to the first electrode, wherein the switching layer includes a bottom surface and a top surface opposite to the bottom surface, an insulator layer is disposed on the top surface of the switching layer, and the first electrode is positioned beneath the bottom surface of the switching layer;

forming a second electrode of the resistive memory element that is coupled to a first side surface of the switching layer; and forming a third electrode of the resistive memory element that is coupled to a second side surface of the switching layer that is opposite to the first side surface.

11. The method of claim 10 further comprising:
forming an interlayer dielectric layer over the switching layer and the first electrode; and
patterning a first opening and a second opening in the interlayer dielectric layer,
wherein the second electrode is formed in the first opening patterned in the interlayer dielectric layer, and the third electrode is formed in the second opening patterned in the interlayer dielectric layer.

12. The method of claim 10 further comprising:
forming the insulator layer on the top surface of the switching layer,
wherein the insulator layer extends from the first side surface of the switching layer to the second side surface of the switching layer.

13. The method of claim 10 wherein the second electrode comprises a first metal, and the third electrode comprises a second metal different in composition from the first metal.

14. The structure of claim 1 further comprising:
an interlayer dielectric layer,
wherein the first electrode is positioned in the interlayer dielectric layer, the interlayer dielectric layer includes a first portion between the first electrode and the second electrode, and the interlayer dielectric layer includes a second portion between the first electrode and the third electrode.

15. The structure of claim 1 further comprising:
an interlayer dielectric layer,
wherein the second electrode and the third electrode are positioned in the interlayer dielectric layer.

16. The structure of claim 1 wherein the second electrode is positioned in contact with the first side surface of the switching layer.

17. The structure of claim 16 wherein the third electrode is positioned in contact with the second side surface of the switching layer.

18. The structure of claim 1 wherein the first electrode contacts only a portion of the bottom surface of the switching layer.

19. The structure of claim 1 further comprising:
a first voltage source configured to provide a first voltage to the second electrode; and
a second voltage source configured to provide a second voltage to the third electrode.

20. The structure of claim 1 wherein the second electrode and the third electrode define respective input terminals configured to be separately and individually biased with different bias voltages.

* * * * *